US005981303A

United States Patent [19]

Gilton

[11] Patent Number: 5,981,303

[45] Date of Patent: Nov. 9, 1999

[54] METHOD OF MAKING FIELD EMITTERS WITH POROUS SILICON

[75] Inventor: Terry L. Gilton, Boise, Id.

[73] Assignee: Micron Technology, Inc., Boise, Id.

[21] Appl. No.: 08/895,523

[22] Filed: Jul. 17, 1997

Related U.S. Application Data

[63] Continuation of application No. 08/307,960, Sep. 16, 1994.

[51] Int. Cl.[6] .......... H01L 21/306

[52] U.S. Cl. .......... 438/20

[58] Field of Search .......... 438/20; 216/11; 445/50, 51

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 4,923,421 | 5/1990 | Brodie et al. | 455/24 |
| 5,232,549 | 8/1993 | Cathey et al. | 456/633 |
| 5,269,877 | 12/1993 | Bol | 156/628 |
| 5,329,207 | 7/1994 | Cathey et al. | 315/169.1 |
| 5,430,300 | 7/1995 | Yue et al. | 445/50 |
| 5,529,524 | 6/1996 | Jones | 445/24 |
| 5,652,474 | 7/1997 | Wilshaw et al. | 313/336 |
| 5,844,251 | 12/1998 | MacDonald et al. | 257/10 |

OTHER PUBLICATIONS

A. Bsiesy, F. Gaspard, R. Herino, M. Ligeon, and F. Muller, "Anodic Oxidation of Porous Silicon Layers Formed on Lightly p–Doped Substrates", *J. Electrochem. Soc.*, vol. 138, No. 11, Nov. 1991, pp. 3450–3456.

T. George, M.S. Anderson, W.T. Pike, T.L. Lin, and R.W. Fathauer, "Microstructural investigations of light–emitting porous Si layers", *Appl. Phys. Lett.*, vol. 60, No. 19, May 11, 1992, pp. 2359–2361.

Hiedeki Koyama and Nobuyoshi Koshida, "Photoelectrochemical Effects of Surface Modification of n–Type Si with Porous Layer", *J. Electrochem, Soc.* vol. 138, No. 1, Jan. 1991, pp. 254–260.

S.O. Izidinov, A.P. Blokhina, and L.A. Ismailova, "Anomalously High Photovoltaic Activity Of Polished n–Type Silicon During Anodic Porous–Layer Formation In Hydrofluoric–Acid Solutions", *Elektrokhimiya*, vol.23, No.11, pp. 1554–1559, Nov., 1987 (Translated), Original article submitted May 8, 1986. This article: *V.I. Lenin All–Union Electrotecnical Institute*, Moscow, pp. 1452–1457.

Tomoyoshi Motohiro, Tetsu Kachi, Fusayoshi Miura, Yasuhiko Takeda, Shi–aki Hyodo, and Shoji Noda, "Excitation Spectra of the Visible Photoluminescence of Anodized Porous Silicon", *J. Appl. Phys.*,1992.

Dennis R. Turner, "Electropolishing Silicon in Hydrofluoric Acid Solutions", *Journal of The Electrochemical Society*, Jul. 1958, pp. 402–408.

Kazuo Imai and Hideyuki Unno, "FIPOS (Full Isolation by Porous Oxidated Silicon) Technology and Its Application to LIS's", IEEE Transactions On Electron Devices, vol. ED–31, No.3, Mar. 1984, pp. 297–301.

H. Seidel, L. Csepregi, A. Heuberger, H. Baumgartel, "Anisotropic Etching of Crystalline Silicon in Alkaline Solutions, II Influence of Dopants", J. Electrochem. Soc., vol. 137, No. 11, Nov. 1990, pp. 3626–3632.

(List continued on next page.)

*Primary Examiner*—Chandra Chaudhari
*Assistant Examiner*—Matthew Whipple

[57] ABSTRACT

A process is provided for forming sharp asperities, useful as field emitters. The process comprises: patterning and doping a silicon substrate. The doped silicon substrate is anodized. The anodized area is then used for field emission tips. The process of the present invention is also useful for low temperature sharpening of tips fabricated by other methods. The tips are anodized, and then exposed to radiant energy, and the resulting oxide is removed.

20 Claims, 5 Drawing Sheets

OTHER PUBLICATIONS

Yoshinobu Arita and Yoshio Sunohara, "Formation and Properties of Porous Silicon Film", *Journal of Electrochemical Society, Solid State Science Technology*, vol. 124, No. 2, pp. 285–295.

H. Seidel, L. Csepregi, A. Heuberger, H. Baumgartel, "Anisotropic Etching of Crystalline Silicon in Alkaline Solutions", *J. Electrochem, Soc.*, vol. 137, No. 11, Nov. 1990, pp. 3612–3626.

R.L. Smith and S.D. Collins, "Porous Si Formation Mechanisms", American Institute of Physics, 1992, pp. R1–R22.

M.I.J. Beale, N.G. Chew, M.J. Uren, A.G. Cullis, J.D. Benjamin, "Microstructure and Formation Mechanism of Porous Silicon", Jan. 1985, pp. 86–88.

Xie et al., "Luminescence and Structural Study of Porous Silicon Films", American Institute of Physics, 1992, pp. 2403–2407.

Koshida et al., "Characterization Studies of P–Type Porous Si and its Photoelectrochemical Activation", J. Electrochem Soc., 1991, pp. 837–841.

Anderson et al., "Investigation of the Electrical Properties of Porous Silicon", J. Electrochem Soc., 1991, pp. 3406–3411.

Donald A. Neamen, "Semiconductor Physics and Devices", Solar Cells, pp. 615–625.

Wolf, Stanley et al., Silicon Processing for the VLSI Era, vol. 1, pp. 407–409, 1986.

Sze, S.M., VLSI Technology, 2nd Ed., pp. 115–116, 1988.

Solomons Graham "Organic Chemistry", 2nd Ed. John Wiley & Sons, New York, pp. 63–64 (1976).

METHOD OF MAKING FIELD EMITTERS WITH POROUS SILICON

This application is a continuation of application Ser. No. 08/307,960, filed Sep. 16, 1994.

FIELD OF THE INVENTION

This invention relates to field emission devices, and more particularly to a method of fabricating field emitters useful in displays.

BACKGROUND OF THE INVENTION

Cathode ray tube (CRT) displays, such as those commonly used in desk-top computer screens, function as a result of a scanning electron beam from an electron gun, impinging on phosphors on a relatively distant screen. The electrons increase the energy level of the phosphors. When the phosphors return to their normal energy level, they release the energy from the electrons as a photon of light, which is transmitted through the glass screen of the display to the viewer. One disadvantage of a CRT is the depth of the display required to accommodate the raster scanner.

Flat panel displays have become increasingly important in appliances requiring lightweight portable screens. Currently, such screens use electroluminescent or liquid crystal technology. Another promising technology is the use of a matrix-addressable array of cold cathode emission devices to excite phosphor on a screen, often referred to as a field emitter display.

Spindt, et. al. discuss field emission cathode structures in U.S. Pat. Nos. 3,665,241, and 3,755,704, and 3,812,559. To produce the desired field emission, a potential source is provided with its positive terminal connected to the gate, or grid, and its negative terminal connected to the emitter electrode (cathode conductor substrate). The potential source is variable for the purpose of controlling the electron emission current.

Upon application of a potential between the electrodes, an electric field is established between the emitter tips and the low potential anode grid, thus causing electrons to be emitted from the cathode tips through the holes in the grid electrode.

SUMMARY OF THE INVENTION

The clarity, or resolution, of a field emission display is a function of a number of factors, including emitter tip sharpness. The process of the present invention is directed toward the fabrication of very sharp cathode emitter tips.

One aspect of the process present invention involves forming sharp asperities useful as field emitters. The process comprises patterning and doping a silicon substrate. The doped silicon substrate is anodized. Where the silicon substrate was doped, regions of very sharply defined spires of porous silicon are formed. These sharp spires or asperities are useful as emitter tips.

Another aspect is fabrication of emitter tips using porous silicon. The method comprises blanket doping and anodizing a silicon substrate. The unmasked, anodized substrate is then exposed to patterned ultra-violet light. The exposed areas are oxidized in air. The oxidized areas are either stripped with hydrofluoric acid, or retained as an isolation mechanism.

A further aspect of the present invention is the sharpening of field emitters. The method comprises anodizing existing silicon emitters, thereby causing the emitters to become porous. The porous silicon tips are exposed to ultra-violet light, and rinsed with a hydrogen halide. The ultra-violet light oxidizes the tips and they become sharper as the oxide is stripped.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
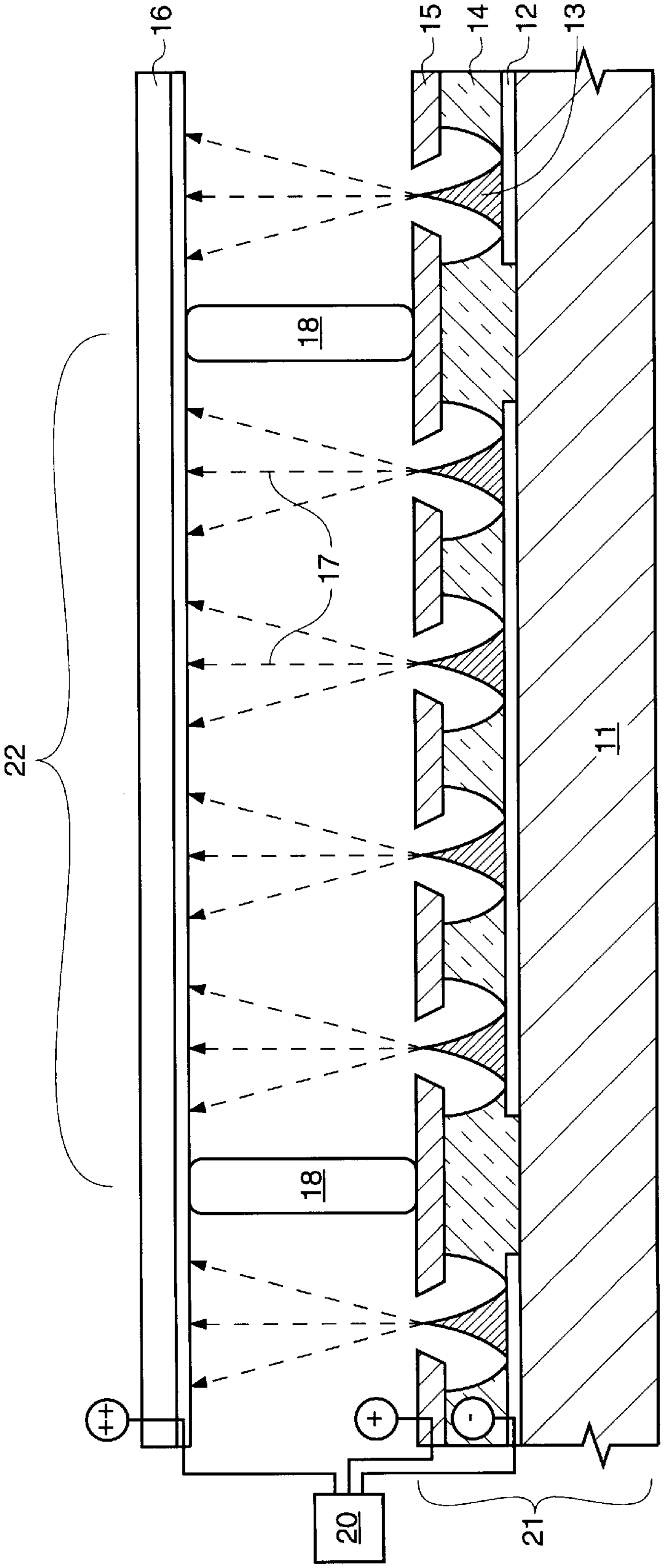
FIG. 1 is a schematic cross-section of a field emission display having emitter tips.

Referring to FIG. 1, a representative field emission display employing a display segment 22 is depicted. Each display segment 22 is capable of displaying a pixel of information, or a portion of a pixel, as, for example, one green dot of a red/green/blue full-color triad pixel.

Preferably, a single crystal silicon layer serves as a substrate 11. Alternatively, amorphous silicon deposited on an underlying substrate comprised largely of glass or other combination may be used as long as a material capable of conducting electrical current is present on the surface of a substrate so that it can be patterned and etched to form micro-cathodes 13.

At a field emission site, a micro-cathode 13 has been constructed on top of the substrate 11. The micro-cathode 13 is a protuberance which may have a variety of shapes, such as pyramidal, conical, or other geometry which has a fine micro-point for the emission of electrons. Surrounding the micro-cathode 13, is a grid structure 15. When a voltage differential, through source 20, is applied between the cathode 13 and the grid 15, a stream of electrons 17 is emitted toward a phosphor coated screen 16. Screen 16 is an anode.

The electron emission tip 13 is integral with substrate 11, and serves as a cathode. Gate 15 serves as a grid structure for applying an electrical field potential to its respective cathode 13.

A dielectric insulating layer 14 is deposited on the conductive cathode 13, which cathode 13 can be formed from the substrate or from one or more deposited conductive films, such as a chromium amorphous silicon bilayer. The insulator 14 also has an opening at the field emission site location.

Disposed between said faceplate 16 and said baseplate 21 are located spacer support structures 18 which function to support the atmospheric pressure which exists on the electrode faceplate 16 as a result of the vacuum which is created between the baseplate 21 and faceplate 16 for the proper functioning of the emitter tips 13.

The baseplate 21 of the invention comprises a matrix addressable array of cold cathode emission structures 13, the substrate 11 on which the emission structures 13 are created, the insulating layer 14, and the anode grid 15.

The process of the present invention provides a method for fabricating very sharp emitter tips 13 useful in displays of the type illustrated in FIG. 1.

Figure 2:
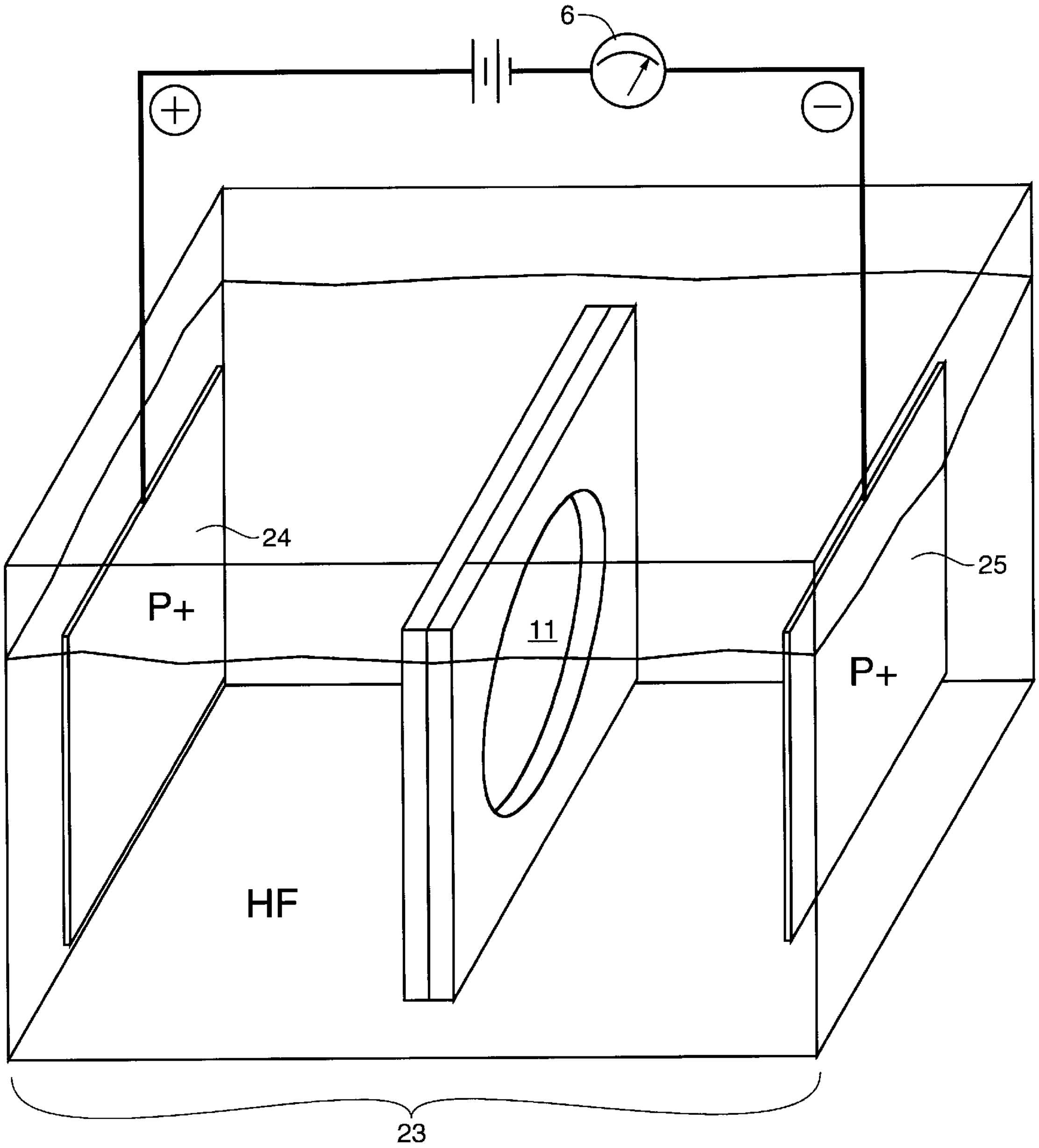
FIG. 2 is a schematic cross-section of an anodization chamber.

FIG. 2 is a schematic cross-section of a representative anodization chamber 23 of the type used in the process of the present invention. A wafer 11 is suspended between two liquid baths, and seals one bath from the other.

In the first bath is disposed a metallic electrode 24, which, in this example, is platinum. The electrode 24 is a cathode, and therefore, has a positive charge when a voltage 26 is placed between the baths. The electrode 25 is placed in the second bath. The electrode 25 is also platinum in this example, and functions as an anode, as electrode 25 has a negative potential when a voltage 26 is placed between the baths.

In addition to water, the second bath also contains a hydrogen halide and a surfactant. The volume ratio of water to hydrogen halide to surfactant is 1:1:1. The preferred surfactant is an alcohol, such as isopropyl alcohol, which is relatively inexpensive and pure, and commercially available. However, ethanol, 2-butanol, and Triton X100 are also suitable surfactants. The preferred hydrogen halide is hydrofluoric acid (HF).

When a voltage 26 is applied between the electrodes 24, 25. The chemicals in the second bath are attracted to the wafer 11, and react with it.

Electrochemical anodization of silicon in hydrofluoric acid etches a network of tiny pores into the silicon surface, and forms a layer of porous material. Porous silicon forms at current densities from 10 to 250 $mA/cm_2$ in hydrofluoric acid concentrations from 1–49 weight percent, with resulting porosities from 27% to 70%.

Figure 3A:
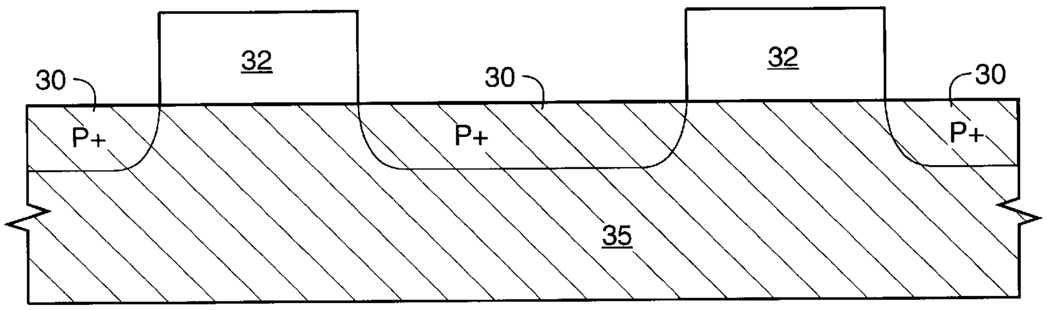
FIGS. 3A–3B are a schematic cross-sections of one embodiment of the process of the present invention.
Figure 3B:
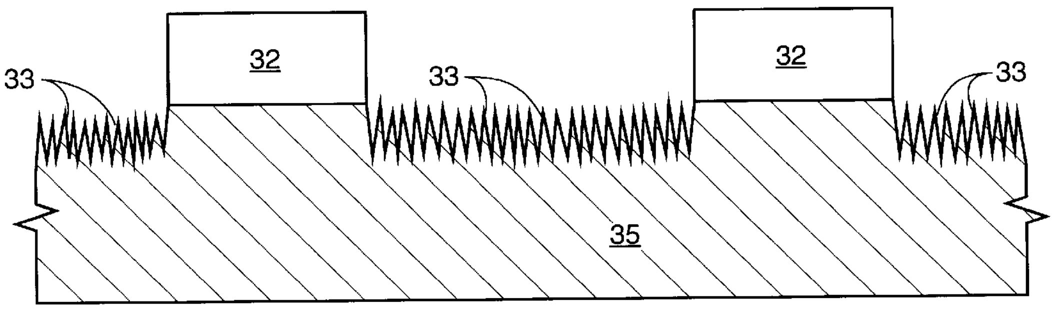

FIGS. 3A–3B illustrate the one embodiment of the process of the present invention. FIG. 3A illustrates a substrate 35 which has been patterned and subsequently doped. The substrate 35 comprises silicon, and can be amorphous silicon, polycrystalline silicon, micro-grain silicon, and macro-grain silicon, or any other suitable silicon-containing substrate.

The substrate 35 is patterned with a mask 32. Mask 32 preferably comprises a photoresist or an oxide. The masked substrate 35 is then doped. The preferable dopant is boron, and therefore the doped regions 30 are P+.

The substrate 35 is then disposed in an anodization chamber 23 of the type described in FIG. 2. The substrate 35 is anodized in the unmasked areas 30. The doped areas 30 become porous 31 as a result of the chemicals reacting with the dopant in the substrate 30. As the anodization process continues, the porous silicon 31 develops a structure having randomly distributed, sharp spires or tips 33, as illustrated in FIG. 3B.

These tips 33 are useful as emitters in flat panel displays of the field emission type. The mask 32 is then stripped and the display fabricated. Alternatively, the mask 32 is left on the substrate 35, and functions as insulating layer 14.

Figure 4A:
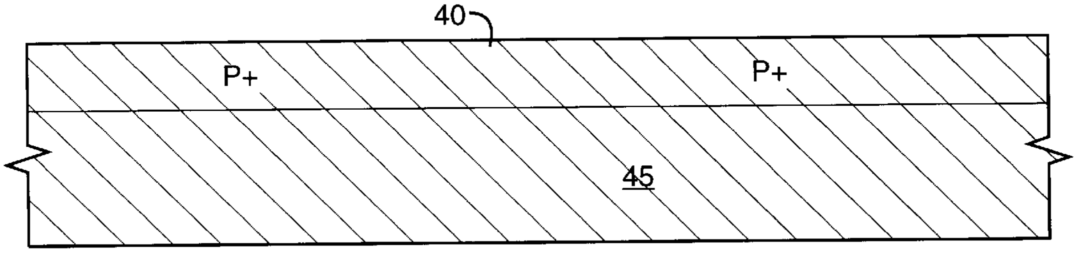
FIGS. 4A–4C are schematic cross-sections of another embodiment of the process of the present invention.
Figure 4B:
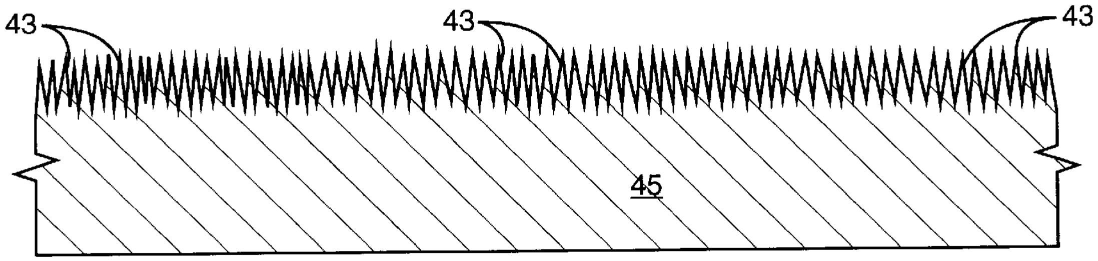
Figure 4C:
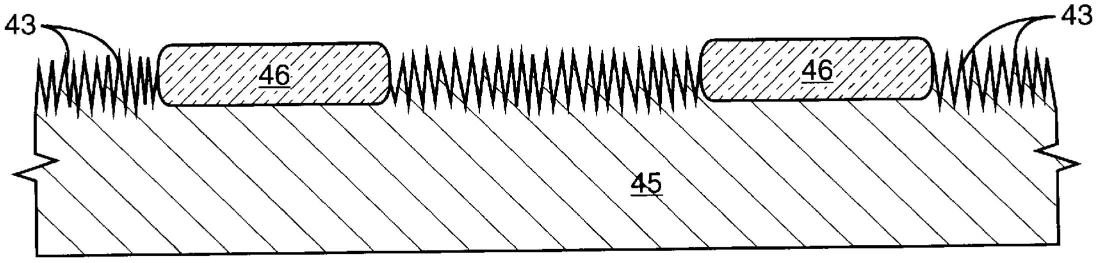

FIGS. 4A–4C illustrate another embodiment of the process of the present invention. FIG. 4A illustrates substrate 45 which is "blanket" doped 40. "Blanket" doping referring to the doping of substantially the entire surface of the substrate 45. As in the previous embodiment, the substrate 45 comprises silicon, and can be amorphous silicon, polycrystalline silicon, micro-grain silicon, and macro-grain silicon, or any other suitable silicon-containing substrate. The preferred dopant in this embodiment is also boron, and therefore the doped layer is P+.

FIG. 4B illustrates the substrate 45 after it has undergone an anodization step, in which the dopant layer 40 becomes porous layer 41. The anodization takes places in a chamber 23 of the type illustrated in FIG. 2. Since substantially the whole surface of the substrate 45 is doped 40 and unmasked, substantially the whole layer 40 is anodized.

Subsequent to the anodization step, substrate 45 is patterned with a mask 42. The mask 42 preferably comprises a photoresist or an oxide. The substrate 45 is then exposed to electromagnetic radiation (e.g., ultra-violet light) at or about room temperature for approximately 5 to 10 minutes. These parameters will vary with the intensity of the light selected.

Alternatively, the substrate 45 is simply exposed to patterned electromagnetic radiation, e.g., light that is shined through a photolithographic mask. This process is analogous to the process for exposing photoresist with a stepper. The preferred wavelength of light is in the ultra-violet spectrum.

The areas exposed to light are oxidized in air (actually, by the oxygen in the atmosphere). The oxidized areas can be used for isolation, or the oxide can be removed by rinsing in a hydrogen halide, such as hydrofluoric acid. The tips 43 are useful as field emitters of the type discussed in FIG. 1.

Figure 5A:
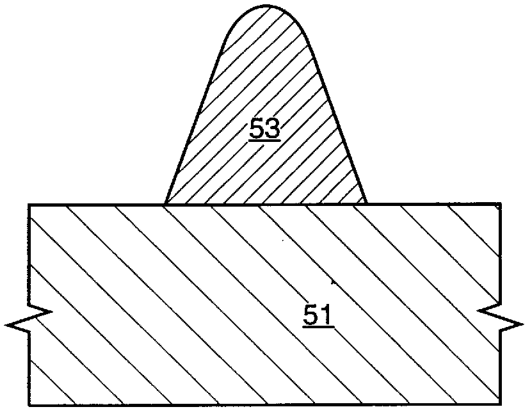
FIGS. 5A–5D are schematic cross-sections of a further embodiment of the process of the present invention.

FIGS. 5A–5D illustrate low temperature oxidation sharpening of emitter tips using the process of the present invention. FIG. 5A illustrates a tip 53 made by any of the methods know in the art, and most commonly comprises silicon. The radius of curvature of the apex of the tip 53 is somewhat rounded.

Figure 5B:
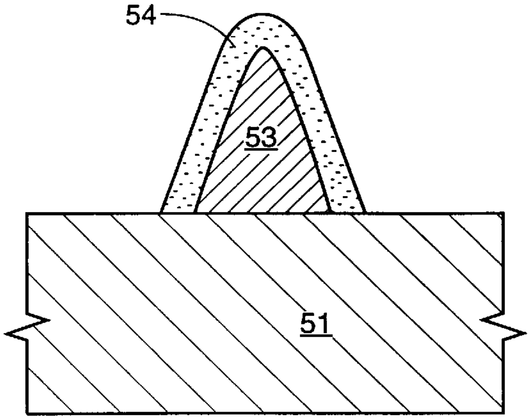

FIG. 5B shows the tip 53 after the tip 53 has been anodized, according to the process of the present invention. The tip 53 is placed in an anodization chamber of the type shown in FIG. 2. A porous layer 54 forms on the tip 53 as a result of the anodization, as shown in FIG. 5B.

Figure 5C:
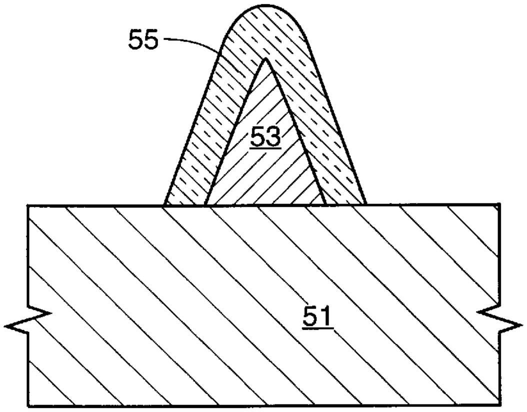

The tip 53 is then exposed to radiant energy, preferably light in the ultra-violet spectrum. The tip 53 is exposed to the ultra-violet light at room temperature (e.g., approximately 22° C.–100° C.) in air. The oxygen in the atmosphere oxidizes the porous silicon 54 on the tip 53, when the tip 53 is irradiated, thereby forming layer 55, as illustrated in FIG. 5C.

Figure 5D:
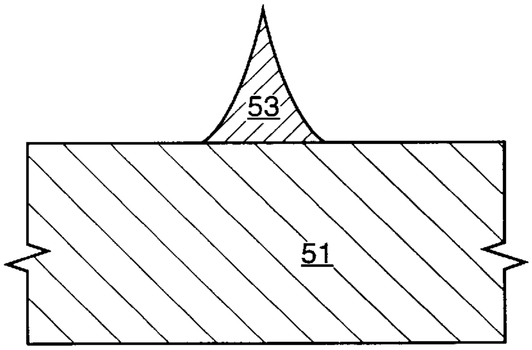

The oxide layer 55 is then stripped, preferably in a hydrogen halide. Hydrofluoric acid (HF) is the preferred hydrogen halide. When the oxide layer 55 is removed, the tip 53 is noticeably sharper, as shown in FIG. 5D.

There are several advantages to the process of the present invention. One of the most important is that the process takes place at or about room temperature. The anodization process of the present invention results in a very high surface area that is easily oxidized. Most oxidation processes of semiconductor substrates are done in a steam ambient requiring high temperatures. The porous silicon is oxidized by ultra-violet light at low temperatures, i.e., 20° C.–100° C.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the parameters can vary.

What is claimed is:

1. A method for fabricating field emitters, said method comprising the following steps of:

forming a pattern on a polycrystalline silicon or amorphous silicon substrate to define isolated exposed regions; and doping said isolated exposed regions of said polycrystalline silicon or amorphous silicon substrate;

anodizing said isolated exposed regions of said polycrystalline silicon or amorphous silicon substrate, thereby defining regions of said field emitter tips, said field emitter tip regions being isolated from adjacent said field emitter tip regions by regions of relatively undoped silicon.

2. The method of fabricating emitters, according to claim 1, wherein said polycrystalline silicon substrate comprises at least one of micro-grain silicon and macro-grain silicon.

3. The method of fabricating emitters, according to claim 1, wherein said anodizing comprises hydrogen halide, water ($H_2O$), and a surfactant.

4. The method of fabricating emitters, according to claim 3, wherein said surfactant comprises at least one of ethanol, isopropyl alcohol, 2-butanol, and Triton X100.

5. The method of fabricating emitters, according to claim 4, wherein said hydrogen halide comprises hydrofluoric acid (HF), said hydrofluoric acid being 49 weight percent prior to anodization.

6. The method of fabricating emitters, according to claim 5, wherein said anodizing takes place in an electrochemical bath, a current of less than 250 $mAmp/cm^2$ being applied to said bath.

7. A process for forming sharp asperities, useful as field emitters, said process comprising the following steps of:

patterning a polycrystalline silicon or amorphous silicon substrate, thereby creating patterned and exposed areas on said silicon substrate;

and selectively anodizing said exposed areas of said polycrystalline silicon or amorphous silicon substrate, thereby forming a plurality of said sharp asperities in each of said exposed areas.

8. The process for forming sharp asperities, according to claim 7, wherein said dopant comprises boron.

9. The process for forming sharp asperities, according to claim 8, wherein said anodization comprises an aqueous solution of a hydrogen halide and a surfactant.

10. The process for forming sharp asperities, according to claim 9, wherein said surfactant comprises at least one of ethanol, isopropyl alcohol, 2-butanol, and Triton X100.

11. The process for forming sharp asperities, according to claim 10, wherein said hydrogen halide is hydrofluoric acid.

12. The process for forming sharp asperities, according to claim 11, wherein said patterning comprises at least one of a photoresist and an oxide mask.

13. The process for forming sharp asperities, according to claim 12, wherein said silicon substrate is anodized in a solution comprising water, hydrofluoric acid, and isopropyl alcohol in a volume ratio of 1:1:1.

14. A method for fabricating isolated arrays of emitter tips, said method comprising the following steps of:

forming patterned and unpatterned regions on a polycrystalline silicon or amorphous silicon substrate;

doping said unpatterned regions of said polycrystalline silicon or amorphous silicon substrate; and anodizing said doped polycrystalline silicon or amorphous silicon substrate, thereby forming said arrays of emitter tips in said unpatterned regions of said doped silicon substrate, said arrays of emitter tips being separated by regions of said unanodized patterned silicon substrate.

15. The method of fabricating emitter tips, according to claim 14, wherein said substrate is patterned with oxide.

16. The method of fabricating emitter tips, according to claim 15, wherein said array of emitter tips are disposed in a field emission display having an anode grid, said oxide functioning as an insulator to electrically isolate said array of emitter tips from said anode grid.

17. The method of fabricating emitter tips, according to claim 15, wherein boron is used to dope said silicon substrate.

18. The method of fabricating emitter tips, according to claim 17, wherein said anodization comprises an aqueous solution of a hydrogen halide and a surfactant.

19. The method of fabricating emitter tips, according to claim 14, wherein said substrate is patterned with photoresist.

20. The method of fabricating emitter tips, according to claim 19, further comprising the step of:

removing the photoresist from the substrate.

* * * * *